United States Patent

Heagerty et al.

[11] 4,054,894
[45] Oct. 18, 1977

[54] EDGELESS TRANSISTOR

[75] Inventors: William Frederick Heagerty, Norristown, Pa.; Luke Dillon, Jr., Marlton, N.J.

[73] Assignee: RCA Corporation, New York, N.Y.

[21] Appl. No.: 581,041

[22] Filed: May 27, 1975

[51] Int. Cl.² .................. H01L 27/12; H01L 29/78
[52] U.S. Cl. .............................. 357/23; 357/4; 357/41; 357/49; 357/52; 357/56
[58] Field of Search ............... 357/4, 23, 41, 42, 56, 357/52, 49

[56] References Cited

U.S. PATENT DOCUMENTS

| 3,840,888 | 10/1974 | Gaensslen et al. | 357/42 |
| 3,890,632 | 6/1975 | Ham et al. | 357/23 |
| 3,898,684 | 8/1975 | Davidsohn | 357/41 |
| 4,015,279 | 3/1977 | Ham | 357/41 |

Primary Examiner—William D. Larkins
Attorney, Agent, or Firm—H. Christoffersen; Robert P. Williams; William L. Muckelroy

[57] ABSTRACT

An MOS mesa transistor is comprised of a silicon island on an insulating substrate. The silicon island consists entirely of a source region, a drain region, and an I-shaped channel region which separates the source and drain regions. The island has a coating of an oxide of silicon thereon. A rectangular conductive gate is adjacent to the coating and above the channel region and the transverse extremities of the I-shaped channel region extend bilaterally and transversely from underneath the gate at each end thereof.

10 Claims, 4 Drawing Figures

U.S. Patent  Oct. 18, 1977  4,054,894
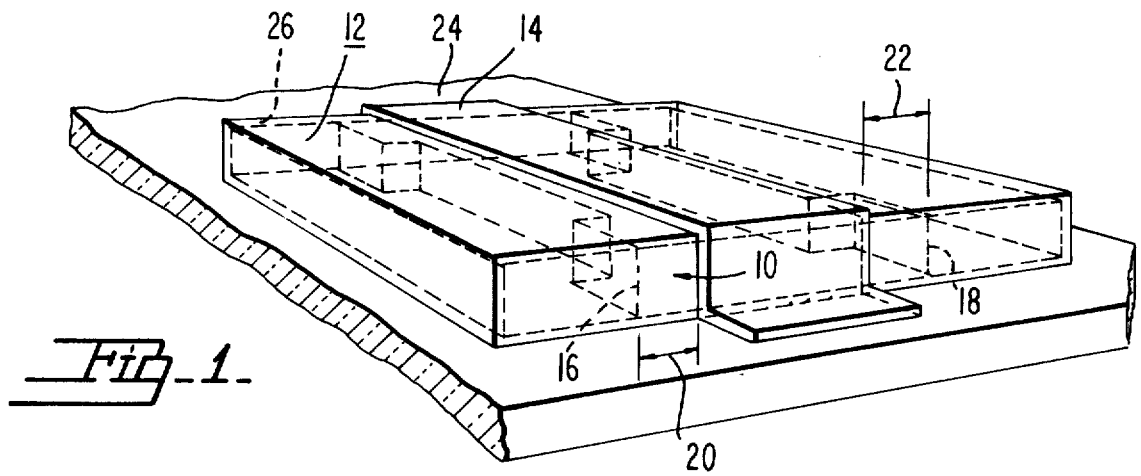
_Fig. 1_
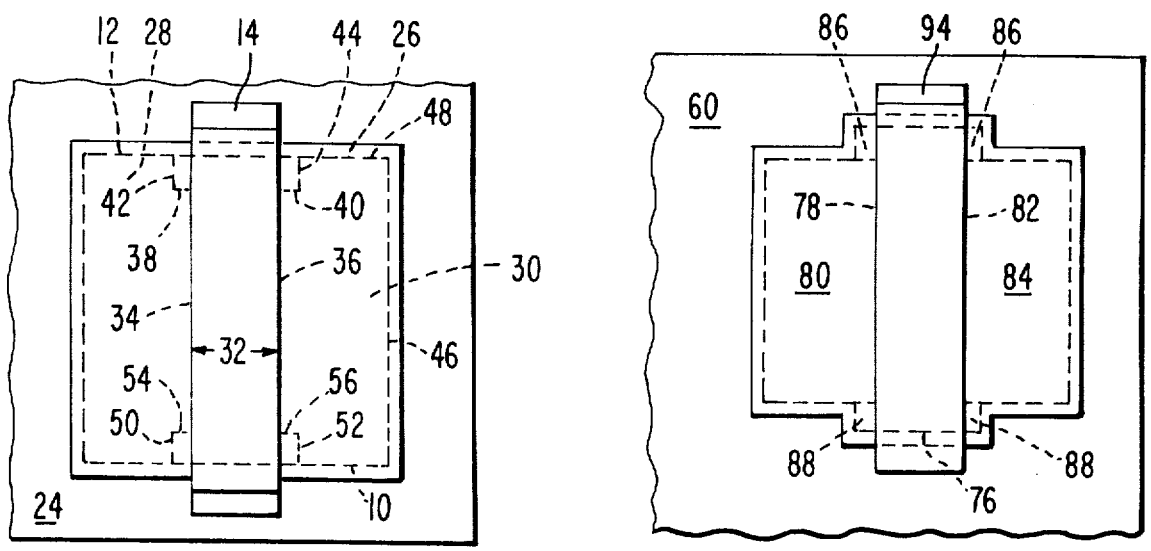
_Fig. 2_  _Fig. 4_
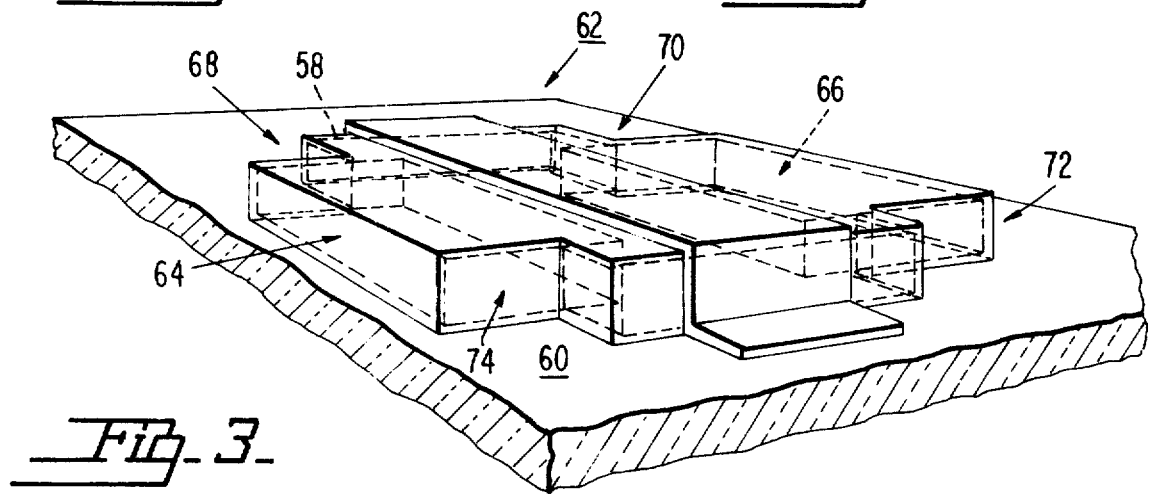
_Fig. 3_

EDGELESS TRANSISTOR

This invention was developed in the course of or under a contract or subcontract thereunder with the Department of the Air Force.

This invention is generally related to that art which encompasses a metal-oxide-semiconductor (MOS) structured transistors made on semiconductor islands (mesas).

The invention is specifically related to structures which eliminate edge effects in MOS mesa transistors having surrounding sidewalls (edges) and more specifically, to structures which reduce the leakage current and junction capacitance in MOS mesa transitors.

The boundary between an edge and a principal surface of an island is referred to herein as a top periphery of the island. A boundary between an edge and a substrate is referred to herein as a botom periphery of the island. Certain anomalous effects in the characteristics of both N channel and P channel MOS transistors occur when a source diffusion and a drain diffusion contact the edge of the semiconductor island and a portion of a gate electrode which extends down the edge of the island onto the substrate, has portions of a source region and a drain region adjacent the oxide underneath the electrode. For example, in a typical MOS/SOS device, a silicon island is formed on a sapphire substrate and an insulating layer of silicon dioxide is formed adjacent to the island and the substrate. The island has sloping sidewalls which form what is sometimes referred to as the edge of the island.

In the manufacture of the device, the source and drain regions are defined by apertures etched in a masking layer, usually silicon dioxide. The regions are formed by a diffusion of impurities through these apertures. A formation of the source and drain regions defines an additional region therebetween, which herein is referred to as a channel region. The active area of the channel region, the channel typically underlies the gate and typically connects the source region to the drain region. The gate is a strip of a conductive material such as, for example, a metal or highly doped polycrystalline silicon. Typically, the gate is deposited on top of an insulator above the channel region bilaterally overlies the channel region in order to align itself inbetween the source region and the drain region.

In the manufacture of the device, the apertures through which the source region and the drain region in the silicon island are formed do not confine the diffusion to the principal surface of the silicon island. The impurities from the source and drain diffusion also make entry into one or more of the sidewalls of the silicon island. Since the gate extends across the sidewall which is adjacent the diffused source and drain, the gate also overlies a channel extension inbetween source and drain regions formed on the sidewall. Hence, an additional transistor comprising an edge source, an edge drain, and an extension of the channel is formed. When a voltage is applied to the gate, the edge transistor, comprised of the edge "source and drain" and channel therebetween usually turns on first and creates instabilities and a hysteresis effect in the I-V characteristic of the transistor. The effect is unstable and it is desirable that the effect be eliminated.

Reference is made to the following drawings wherein:

FIG. 1 is a perspective view of a first perferred embodiment of the invention;

FIG. 2 is a top view of the first preferred embodiment of the invention;

FIG. 3 is a perspective view of a second preferred embodiment of the invention; and FIG. 4 is a top view of the second preferred embodiment of the invention.

The concept embodied in the present novel invention is an isolation of any junction formed on an edge of a mesa transistor by extending a small portion of a channel adjacent to the edge and all of the channel on the edge from beneath a gate at a location at which the gate contacts the edge of the mesa. Thus, a depletion or inversion of a channel region on the edge and that portion of the channel region adjacent the edge of the mesa is prevented. Normally, if the gate overlies the channel region at the edge of the mesa, a voltage smaller than that required to turn on the transistor on a principal surface, applied to the gate, could invert or deplete the channel region on the edge and thus enable an edge device to operate. Thus, this invention solves an edge junction problem, but more important, the device of the present novel invention insignificantly increases the junction capacitance and the leakage current.

There are two preferred embodiments of the invention. One requires an I-shaped mask for the channel region (see FIG. 2) and the other requires a cross-shaped mask for a semi-conductor island in combination with the I-shaped mask for the channel region (see FIG. 4).

"Edges" as discussed herein are comprised of the minor surfaces (sloping sidewalls) of the semiconductor island. These minor surfaces are those portions of the semiconductor island between a substrate and a principal (top) surface of the island. The minor surfaces of the semiconductor island which underlie the gate contain the so-called "edge junctions." For example, in FIG. 1, a minor surface 10 of a semiconductor island 12 which underlies a gate 14 has a PN junction 16 thereon and a PN junction 18 thereon. The junctions 16 and 18 abutting the surface 10 do not underlie the gate 14 and so regions 20 and 22 are not invertible by the gate 14.

The terms "line" and "line segment" as used herein refer to an edge or a top boundary of a surface which abuts the substrate. The surface extends from the principal surface of the semiconductor island to the substrate. Accordingly, the source and the drain as referred to herein may extend from the principal surface of the semiconductor island which is spaced from the substrate to another surface of the semiconductor island which is adjacent the substrate.

Referring now to FIG. 2, a top view of FIG. 1, there is shown a substrate 24 with the semiconductor island 12 thereon and an insulator 26 of silicon dioxide on the surfaces of the island 12. A defined source 28 and a defined drain 30 extend to the sidewalls and the corners of the semiconductor island 12. The source 28 and the drain 30 are T-shaped and are arranged so as to define a channel region 32 in a shape of an "I." A central portion of the channel region 32 is bounded by co-parallel boundary surfaces the top edges of which are represented by lines 34 and 36 which also represent a portion of the boundaries for the principal surfaces of the source 28 and the drain 30, respectively. The end portions of the channel region 32 are rectangular surfaces, each coplanar with the central portion and each transverse to the central portion and each bilaterally connected to the central portion. The rectangular end portions of the channel region 32 are further defined by additional boundaries of the source region and the drain region which may be characterized as two sides of each of two rectangular surfaces, or line segments 38 and 40, respectively. Line segment 38 intersects the boundary line 34 and line segment 40 intersects the boundary line 36. Additional boundaries of the source 28 and the drain 30, line segments 42 and 44, respectively, form two other sides for the two rectangular end portions. Line segments 42 and 44 are parallel to the gate 14 and have only the insulator 26 above. Line segment 42 interconnects line segment 38 to the top periphery of the island 12. Line segment 44 interconnects line segment 40 to the same top periphery of the semiconductor island 12. Line segments 42 and 44 do not underlie the gate 14. Line segments 38 and 40 abut the gate 14 (they may be partially underneath the gate in non-self-aligned gate devices.) The boundaries of the drain region 30 are a mirror image of the boundaries of the source region 28. Regions 28 and 30 are bilaterally placed with respect to the gate 14. The drain region 30 is further bounded by the minor surfaces 10, 46, and 48 of the semiconductor island 12. Parallel line segments 50 and 52 extend perpendicular to the surface 10, along the principal surface of the island parallel to the gate 14 and are, respectively, connected to boundary line segments 54 and 65, each of which extends underneath the gate 14 and connects, respectively, to the boundary lines 34 and 36 to form two additional end portions adjacent the central portion.

The junction capacitance of the transistor of the invention is merely increased relative to known structures by the sum of the junction areas created by the diffusion down into the semiconductor island at the boundary line segments 38, 40, 42, 44, 50, 52, 54, and 56. These last said segments typically range from 2.5 to 7.5 μm in length. The active channel region is between the boundary line segments 34 and 36. Typically, each of the last said line segments are coequal and at least 7.5 μm in length. The segments 34 and 36 are separated by at least 7.5 μm.

The portions of the principal surface of the silicon island 12 comprising the source and drain regions adjacent and perpendicular to the boundary line segments 42, 44, 50, and 52 are dispensible. Accordingly, it is not necessary to use the familiar rectangular mask for the island 12. A cruciform mask for defining the semiconductor island eliminates the superfluous portions of the island 12 forementioned. An embodiment of invention wherein such a mask is used to define the semiconductor island is illustrated in FIG. 3, which shows a silicon island 58 formed on a sapphire substrate 60 in a cruciform structure.

The embodiment 62 operates in the same manner as the one shown in FIG. 2. The difference is that the unnecessary areas of the source and drain regions have been removed. Source and drain regions 64 and 66 are thus rectangular. This shape for the source and drain regions 64 and 66 is caused by notches 68, 70, 72, and 74 in place of corners for the island 58. Viewing the device of FIG. 3 from the top as illustrated in FIG. 4 it may be observed that an active region of a channel 76 is bounded by a boundary line segment 78 of a source region 80 and a boundary line segment 82 of a drain region 84. As in the previous embodiment, the channel region 76 is I-shaped with pairs of end portions 86 and 88 extending bilaterally away from a gate 94.

Referring to FIG. 1; a mesa device substantially as illustrated therein may be fabricated, as shown, on the subsrate 24 by etching an island 12 in a semiconductor layer formed on the substrate 24. The island 12 may be comprised of a semiconductor such as, for example, silicon. The substrate 24 may be made of a single crystal material such as, for example, sapphire. Semiconductor material of either P-type or N-type single crystal (100) silicon may be grown by pyrolysis of silane and hydrogen at approximately 960° C onto the (1102) face of a polished sapphire substrate which has been prefired in hydrogen, $H_2$. The isolated silicon island 12 may be formed from this material by a well-known "selective etch process." For N doped silicon the island 12 may be doped to approximately $1.5 \times 10^{15} cm^{-3}$ with an N dopant, such as, for example, phosphorus. For P doped silicon, boron may be diffused into the island to a density of $1.2 \times 10^{15}$ atoms/cm³. The diffusions referred to in the present example may be performed at 1,000° C in helium. The gate insulator 14 of a dielectric, such as, for example, silicon dioxide, is typically grown to a thickness of 1,200 A at approximately 900° C in a HCL-steam system. Alternatively, an $SiO_2$ insulator may be grown at approximately 940° C in wet oxygen and annealed in helium at approximately 1,000° C. The insulator is adjacent to those surfaces of the island 12 not adjacent the substrate 24. The gate 16 is vacuum deposited and may be of, for example, high purity aluminum. Polycrystalline silicon may also be grown and used as a gate contact. Typically, the aluminum gate deposition is approximately 14,000 A thick. The shape of the gate is defined by the standard "photoresist mask and etch" technique.

A basic principle which underlies the present novel invention and which limits its application is the control of the conductivity or conduction for a source region to a drain region by a gate. Therefore, the invention is especially applicable to enhancement mode MOS transistors. In an MOS transistor operating in the enhancement mode the channel is not normally conducting and therefore inverts and increases in conductivity in response to a voltage applied to the gate. Accordingly, one version of the invention is an enhancement mode MOS transistor wherein portions of the channel region adjacent to the channel at the edge of the transistor are not invertible by a voltage on the gate.

PN junctions in fact are not sharply defined and under magnification gates and gate oxides are shown as not sharply defined. Thus, it is to be understood that the line segments and boundaries referred to herein are approximations and used merely to facilitate a detailed description of the operative and novel geometric aspects of the present invention.

What is claimed is:

1. A metal-oxide-semiconductor transistor comprising a semiconductor island, a layer of an insulator adjacent the island, a gate electrode adjacent the insulator, the island comprising heavily doped T-shaped source and drain regions of a first conductivity type, a lesser doped I-shaped channel region between said source and drain regions the channel region having a central portion comprising a channel controllable by the gate, the gate overlying the channel, a pair of end portions of the second conductivity type doped to a carrier concentration of about $10^{15}$ atoms/cm³ or less connected to each end of the channel, the channel being located only underneath the gate, the end portions each extending away from the gate and the channel and terminating away from the gate and the channel adjacent the source or the drain region, each end portion being separate and disjoined from the others.

2. The transistor of claim 1, wherein the channel region has a conductivity type opposite from that of the source and drain regions.

3. The transistor of claim 2, wherein two pairs of the end portions, each pair being located at an edge of the island, are connected bilaterally and symmetrically to the channel, each pair having an end portion bounded by surfaces coplanar with a surface of the channel, said end portion being further bounded by surfaces of the source and an island edge, each pair having another end portion bounded by the surfaces coplanar with a surface of the channel the last said end portion being further bounded by surfaces of the drain and the island edge, whereby a substantially I-shaped channel region is formed.

4. The transistor of claim 3, wherein each end portion is adjacent the insulator, each end portion having only an insulator above.

5. The transistor of claim 4, wherein two end portions are adjacent the source region and two end portions are adjacent the drain region, and wherein each end portion is adjacent a portion of a top periphery of the island.

6. The transistor of claim 5 further comprising an insulating substrate adjacent the semiconductor island.

7. The transistor of claim 6, wherin the island is comprised of silicon, the insulator is comprised of an oxide of silicon, and the gate is comprised of a metal.

8. The transistor of claim 6, wherein the substrate is comprised of sapphire.

9. The transistor of claim 8, wherein the gate is comprised of either aluminum or polycrystalline silicon.

10. A metal-oxide-semiconductor transistor comprising a cruciform shaped semiconductor island, a layer of an insulator adjacent the island, a gate adjacent the insulator, the island comprising heavily doped rectangular source and drain regions of the first conductivity type, a lesser doped I-shaped channel region between said source and drain regions, the channel region having a central portion comprising a channel controllable by the gate, the gate overlying the channel, a pair of end portions of the second conductivity type doped to a carrier concentration of about $10^{15}$ atoms/cm$^3$ or less connected to each end of the channel, the channel being located only underneath the gate, the end portions each extending away from the gate and the channel and terminating away from the gate and the channel adjacent the source region or the drain region, each end portion being separate and disjoined from the other, the cruciform semiconductor island having four orthogonal, co-planar members, the two end portions comprising two diametrical members.

* * * * *